US006506822B2

(12) United States Patent
Ichiroku et al.

(10) Patent No.: US 6,506,822 B2
(45) Date of Patent: Jan. 14, 2003

(54) EPOXY RESIN COMPOSITION

(75) Inventors: Nobuhiro Ichiroku; Miyuki Wakao; Toshio Shiobara, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/898,026

(22) Filed: Jul. 5, 2001

(65) Prior Publication Data

US 2002/0022681 A1 Feb. 21, 2002

(30) Foreign Application Priority Data

Jul. 5, 2000 (JP) ........................................ 2000-204413

(51) Int. Cl.$^7$ ............................................... C08L 63/00
(52) U.S. Cl. ........................ 523/435; 525/476; 523/443
(58) Field of Search ........................... 525/476; 523/435, 523/443

(56) References Cited

U.S. PATENT DOCUMENTS 5,965,637 A * 10/1999 Pfander et al. ............. 523/440

FOREIGN PATENT DOCUMENTS

| JP | B442043 | 7/1992 |
| JP | A5261206 | 10/1993 |
| JP | A5261207 | 10/1993 |

* cited by examiner

Primary Examiner—Margaret G. Moore
(74) Attorney, Agent, or Firm—Birch, Stewart, Kolasch & Birch, LLP.

(57) ABSTRACT

An epoxy resin composition comprising (A) an epoxy resin, (B) a curing agent, and (C) a silicone stress-reducing agent further includes (D) a foam-suppressing composition comprising (D-i) an oil compound consisting of a hydrophobic organopolysiloxane and finely divided silica, (D-ii) a hydrophilic polyoxyalkylene-modified silicone oil, and optionally, (D-iii) a polyoxyalkylene polymer. The epoxy resin composition has the advantages of improved infiltration to semiconductor device-substrate gaps and minimized formation of internal and surface voids.

9 Claims, No Drawings

EPOXY RESIN COMPOSITION

This invention relates to epoxy resin compositions having advantages including minimized formation of internal and surface voids, effective infiltration to semiconductor devices, and firm adhesion of cured compositions to substrates, and thus suitable for the encapsulation of semiconductor devices by potting, chip-on-bonding or screen printing.

BACKGROUND ART

Because of good cured physical properties, epoxy resin compositions are used in a wide variety of fields including electric and electronic fields. Upon application, they are given any suitable flow property, for example, an extremely low viscosity or a highly thixotropic state for ease of operation.

For the encapsulation of semiconductor devices, sealing methods including potting, chip-on-bonding (COB) and screen printing are now widely employed. The potting and COB methods require that the resin flow into very narrow gaps between gold wires extending from the semiconductor chip. The screen printing method requires that the resin maintain its shape after encapsulation. This means that a good compromise between thixotropy and flow must be found. Prior art liquid epoxy resin compositions suffer from the problem of short filling or infiltration.

Epoxy resin compositions also suffer from the problem of air bubbles resulting in defective parts. During potting or dripping, bubbles are often introduced, which cannot be removed during the curing step and are left as voids in the interior and on the surface. In the case of screen printing, bubbles are generated by a squeegee during printing and left as voids on the surface. In the case of transfer molding, air is carried in during flow from the gate to the cavity and left as internal voids.

It is well known to add surfactants to epoxy resin compositions in order to reduce voids. Known surfactants are fluorochemical surfactants such as Florade FC-170C, FC-430 and FC-431 from 3M-Sumitomo Co., Ltd. and silicone surfactants such as KF351, KF945 and KF618 from Shin-Etsu Chemical Co., Ltd. However, where silicone plasticizers are added to epoxy resin compositions, surfactants commonly used as anti-foaming agents are not effective for inhibiting the formation of bubbles. It is impossible to completely remove voids in such silicone component-containing compositions. A study has not been made on the anti-foaming problem associated with the sealing methods including potting, COB and screen printing. It is merely attempted to reduce the viscosity or thixotropy of the resin in order to improve infiltration.

SUMMARY OF THE INVENTION

An object of the invention is to provide epoxy resin compositions having advantages including minimized formation of internal and surface voids, effective infiltration to semiconductor devices, and firm adhesion of cured compositions to substrates.

We have found that in an epoxy resin composition comprising (A) an epoxy resin, (B) a curing agent and (C) a silicone stress-reducing agent, the addition of (D) a foam-suppressing composition comprising (D-i) an oil compound consisting of a hydrophobic organopolysiloxane of the general formula (1) shown below and finely divided silica, (D-ii) a hydrophilic polyoxyalkylene-modified silicone oil of the general formula (2) shown below, and optionally, (D-iii) a polyoxyalkylene polymer is effective for eliminating and breaking bubbles. As a consequence, the formation of voids within the interior or on the surface of a cured product is fully inhibited. The epoxy resin composition is given an ability to infiltrate into semiconductor devices. The composition is fully adherent to various substrates. The addition of foam-suppressing composition (D) does not affect the physical properties of the cured composition. Therefore, the resultant epoxy resin composition is advantageously employed in the encapsulation of semiconductor devices by such techniques as potting, COB and screen printing.

According to the invention, there is provided an epoxy resin composition comprising (A) an epoxy resin, (B) a curing agent, (C) a silicone stress-reducing agent, and (D) a foam-suppressing composition. The foam-suppressing composition (D) is comprised of:

(D-i) 5 to 60% by weight of an oil compound consisting of 100 parts by weight of a hydrophobic organopolysiloxane of the following general formula (1):

wherein $R^1$ is at least one group selected from hydroxyl groups and substituted or unsubstituted monovalent hydrocarbon groups of 1 to 18 carbon atoms, and "a" is a number of 1.9 to 2.2, having a viscosity of 10 to 500,000 centistokes at 25° C., and 0.1 to 20 parts by weight of finely divided silica having a BET specific surface area of at least 100 $m^2/g$, (D-ii) 5 to 95% by weight of a hydrophilic polyoxyalkylene-modified silicone oil of the following general formula (2):

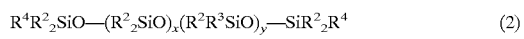

wherein $R^2$ which may be the same or different is a substituted or unsubstituted monovalent hydrocarbon group of 1 to 18 carbon atoms, $R^3$ is a group of the formula: —$R^5O(R^6O)_b(R^7O)_c$-$R^8$ wherein $R^5$ is a divalent C1–C4 hydrocarbon group, $R^6$ is ethylene, $R^7$ is propylene, $R^8$ is hydrogen or a monovalent organic group selected from the class consisting of C1–C6 alkyl, acetyl and isocyanate groups, b is an integer of 3 to 100, c is an integer of 0 to 100, $R^4$ is as defined for $R^2$ or $R^3$, x is an integer of 5 to 100, and y is an integer of 1 to 10, having a cloud point in 1% aqueous solution of at least 40° C. and a viscosity of 10 to 100,000 centistokes at 25° C., and (D-iii) 0 to 90% by weight of a polyoxyalkylene polymer having a molecular weight of 500 to 5,000. The foam-suppressing composition (D) is present in an amount of $1 \times 10^{-4}$ to 20 parts by weight per 100 parts by weight of components (A) and (B) combined.

DESCRIPTION OF THE PREFERRED EMBODIMENTS

Briefly stated, the epoxy resin composition of the invention is defined as comprising (A) an epoxy resin, (B) a curing agent, (C) a silicone stress-reducing agent, and (D) a foam-suppressing composition.

The epoxy resin (A) used herein is not particularly limited with respect to molecular structure, molecular weight and other factors as long as it has at least two epoxy groups per molecule. Examples of the epoxy resin which can be used herein include bisphenol type epoxy resins such as bisphenol A type epoxy resins and bisphenol F type epoxy resins; novolac type epoxy resins such as phenol novolac type epoxy resins and cresol novolac type epoxy resins; triphenolalkane type epoxy resins such as triphenolmethane type epoxy resins and triphenolpropane type epoxy resins; phenolaralkyl type epoxy resins, biphenylaralkyl type epoxy resins, stilbene type epoxy resins, naphthalene type epoxy resins, biphenyl type epoxy resins, and cyclopentadiene type epoxy resins. These epoxy resins may be used alone or in admixture of two or more.

Where liquid epoxy resin compositions are desirable, there may be used any epoxy resin which has at least two epoxy groups per molecule and is liquid at room temperature (typically 25° C.). Preferred are bisphenol type epoxy resins such as bisphenol A type epoxy resins and bisphenol F type epoxy resins, and naphthalene type epoxy resins.

The curing agent (B) used herein is not particularly limited with respect to molecular structure, molecular weight and other factors. Any compound known as the curing agent may be used as long as it has at least two functional groups capable of reacting with epoxy groups in the epoxy resin. Exemplary functional groups are phenolic hydroxyl groups, amino groups and acid anhydride groups (with the proviso that the compound may have at least one acid anhydride group). A variety of phenolic resins are useful, including phenolic resins having at least two phenolic hydroxyl groups per molecule, for example, novolac type phenolic resins such as phenol novolac resins and cresol novolac resins; xylylene-modified novolac resins such as p-xylylene-modified novolac resins, m-xylylene-modified novolac resins, and o-xylylene-modified novolac resins; bisphenol type phenolic resins such as bisphenol A type resins and bisphenol F type resins; biphenyl type phenolic resins, resol type phenolic resins, phenol aralkyl type resins, biphenyl aralkyl type resins, triphenolalkane type resins and polymers thereof such as triphenolmethane type resins and triphenolpropane type resins; naphthalene ring-bearing phenolic resins; and dicyclopentadiene-modified phenolic resins. Amine and acid anhydride type curing agents are also useful.

Of these, phenolic resins are preferable where the inventive composition is adapted for transfer molding.

Where liquid epoxy resin compositions are desirable, acid anhydrides are preferred curing agents. Exemplary acid anhydrides are those of about 4 to 25 carbon atoms, preferably about 8 to 20 carbon atoms, preferably containing one or two aliphatic or aromatic rings and one or two acid anhydride groups (i.e., —CO—O—CO—) in a molecule, such as tetrahydrophthalic anhydride, methyltetrahydrophthalic anhydride, methylhexahydrophthalic anhydride, hexahydrophthalic anhydride, methylhymic anhydride, pyromellitic acid dianhydride, benzophenonetetracarboxylic acid dianhydride, 3,3',4,4'-biphenyltetracarboxylic acid dianhydride, bis(3,4-dicarboxyphenyl)ether dianhydride, bis (3,4-dicarboxyphenyl)methane dianhydride, and 2,2-bis(3, 4-dicarboxyphenyl)propane dianhydride.

As the curing agent for use in liquid epoxy resin compositions, dicyandiamide and carboxylic acid hydrazides such as adipic acid hydrazide and isophthalic acid hydrazide are also useful.

The amount of the curing agent blended is an effective amount to cure the epoxy resin and selected as appropriate from a wide range. Where a phenolic resin is used as the curing agent, it is used in such amounts as to give 0.5 to 2.0 mol, especially 0.8 to 1.3 mol of phenolic OH groups per mol of epoxy groups in the epoxy resin. Where an acid anhydride is used as the curing agent, it is preferably blended so as to give 0.3 to 0.7 mol of acid anhydride (—CO—O—CO—) groups per mol of epoxy groups in the epoxy resin. Less than 0.3 mol of acid anhydride groups may induce insufficient cure whereas an amount giving more than 0.7 mol of acid anhydride groups may leave part of the acid anhydride unreacted, which leads to a drop of glass transition temperature. It is more desirable that 0.4 to 0.6 mol of acid anhydride groups be available per mol of epoxy groups in the epoxy resin.

If desired, a curing accelerator is used for accelerating curing reaction of epoxy resin (A) with curing agent (B). Illustratively, one or more curing accelerators selected from imidazole derivatives, tertiary amine compounds, and organic phosphorus compounds may be blended. Exemplary imidazole derivatives are 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole.

Exemplary tertiary amine compounds are amine compounds having alkyl or aralkyl groups as the substituent attached to the nitrogen atom such as triethylamine, benzyltrimethylamine, and α-methylbenzyldimethylamine; cycloamidine compounds and salts thereof with organic acids such as 1,8-diazabicyclo[5.4.0]undecene-7 and the phenol salt, octylic acid salt, and oleic acid salt thereof; salts or complex salts of cycloamidine compounds with quaternary boron compounds such as the compound represented by the following formula.

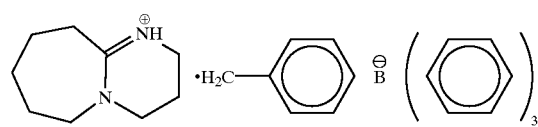

Exemplary organic phosphorus compounds are triorganophosphine compounds such as triphenylphosphine, tributylphosphine, tri(p-methylphenyl)phosphine, tri (nonylphenyl)phosphine, and triphenylphosphine triphenylboran, and quaternary phosphonium salts such as tetraphenylphosphonium tetraphenyl borate.

An appropriate amount of the curing accelerator blended is 0.01 to 10 parts, and desirably 0.5 to 5 parts by weight per 100 parts by weight of the epoxy resin and curing agent combined. Less than 0.01 part of the curing accelerator may not be effective for accelerating cure whereas more than 10 parts is effective for accelerating cure, but tends to detract from storage stability.

The silicone stress-reducing agent (C) may be selected from among silicone rubbers, silicone oils, silicone-modified resins, and copolymers of silicone polymers with organic polymers such as substituted or unsubstituted phenol novolac resins and epoxy resins. Of the copolymers, preferred are block copolymers of alkenyl group-bearing epoxy resins or phenolic resins with SiH group-bearing organopolysiloxane, resulting from hydrosilylation addition reaction between alkenyl groups on the epoxy resins or phenolic resins and SiH groups on the organopolysiloxane. The blending of the silicone stress-reducing agent is effective for minimizing the generation of cracks in cured packages on a thermal shock test.

Preferably, the silicone polymers used to form the copolymers are of the following average compositional formula (4).

(4)

Herein, $R^{12}$ is hydrogen, an organic group having a functional group selected from among hydroxyl, amino, epoxy, carboxyl, alkoxy, alkoxyalkoxy and alkenyloxy groups, an alkoxy group, or an alkenyloxy group; $R^{13}$ is a substituted or unsubstituted monovalent hydrocarbon group; d and e are numbers satisfying $0.001 \leq d \leq 1$, $1 \leq e \leq 3$ and $1 \leq d+e < 4$. The number of silicon atoms per molecule is an integer of 2 to 1,000. The number of silicon atom-bonded $R^{12}$ groups per molecule is an integer of at least 1.

Examples of $R^{12}$ group include hydrogen, organic groups having a functional group selected from among hydroxyl, amino, epoxy, carboxyl, alkoxy groups (e.g., methoxy, ethoxy, n-propoxy, butoxy, methoxyethoxy and ethoxyethoxy), alkoxyalkoxy groups and alkenyloxy groups. $R^{13}$ represents substituted or unsubstituted monovalent hydrocarbon groups, preferably of 1 to 10 carbon atoms, for example, alkyl groups such as methyl, ethyl, n-propyl and n-butyl; alkenyl groups such as vinyl and allyl; aryl groups such as phenyl and tolyl; aralkyl groups such as benzyl and phenylethyl; and the foregoing groups in which some or all of the hydrogen atoms are substituted with halogen atoms, alkoxysilyl groups or the like, such as chloromethyl, 3,3,3-trifluoropropyl, trimethoxysilylethyl, and methyldimethoxysilylethyl.

The silicone polymer preferably has a molecular weight of 100 to 70,000, though it is not limited thereto. This is because an organopolysiloxane or silicone polymer having a molecular weight of 100 to 70,000 ensures that when a copolymer of an aromatic polymer with an organopolysiloxane or silicone polymer is blended in a thermosetting resin composition, the copolymer remains incompatible with the matrix and forms a fine island-in-sea structure. With a molecular weight of less than 100, the resulting copolymer may fail to impart a friction ability or a high glass transition temperature when blended in a thermosetting resin composition. If the molecular weight of organopolysiloxane exceeds 70,000, the resulting copolymer may become incompatible with the thermosetting resin and be separated, resulting in poor flexural strength.

For the purpose of stress reduction, the silicone stress-reducing agent (C) is preferably contained in an amount of 1 to 25 parts by weight per 100 parts by weight of the epoxy resin and the curing agent combined. The more preferred amount is 2 to 15 parts by weight. Less than 1 part of the stress-reducing agent may be ineffective for the purpose whereas blending of more than 25 parts of the stress-reducing agent may increase the viscosity of the epoxy resin composition to interfere with molding thereof.

While the epoxy resin composition is described above as comprising the epoxy resin (A), curing agent (B) and silicone stress-reducing agent (C), the present invention is characterized in that (D) a foam-suppressing composition comprising (D-i) an oil compound consisting of a hydrophobic organopolysiloxane of the general formula (1) shown below and finely divided silica, (D-ii) a hydrophilic polyoxyalkylene-modified silicone oil of the general formula (2) shown below, and optionally, (D-iii) a polyoxyalkylene polymer is blended in the composition in an amount of $1 \times 10^{-4}$ to 20 parts by weight per 100 parts by weight of components (A) and (B) combined.

Component (D-i) is an oil compound consisting of 100 parts by weight of a hydrophobic organopolysiloxane of the following general formula (1) having a viscosity of 10 to 500,000 centistokes at 25° C. and 0.1 to 20 parts by weight of finely divided silica having a BET specific surface area of at least 100 m$^2$/g.

(1)

Herein $R^1$ is selected from hydroxyl groups and substituted or unsubstituted monovalent hydrocarbon groups of 1 to 18 carbon atoms, and "a" is a positive number of 1.9 to 2.2. Illustratively, $R^1$ represents hydroxyl groups or substituted or unsubstituted monovalent hydrocarbon groups of 1 to 18 carbon atoms, especially 1 to 8 carbon atoms, for example, alkyl groups such as methyl, ethyl, propyl, butyl, pentyl, hexyl, heptyl, octyl, nonyl, decyl, dodecyl, tetradecyl, hexadecyl, and octadecyl; cycloalkyl groups such as cyclohexyl; alkenyl groups such as vinyl and allyl; aryl groups such as phenyl and tolyl; aralkyl groups such as 2-phenylethyl and 2-methyl-2-phenylethyl; and the foregoing groups in which some or all of the hydrogen atoms attached to carbon atoms are substituted with halogen atoms, cyano groups, amino groups or the like, such as chloromethyl, 3-chloropropyl, 3,3,3-trifluoropropyl, cyanoethyl, 3-aminopropyl, and N-(β-aminoethyl)-γ-aminopropyl. $R^1$ groups may be the same or different although it is preferred that at least 80 mol % of the entire $R^1$ groups be methyl.

The organopolysiloxane is merely required to be liquid at room temperature although the anti-foaming and working standpoints require it to have a viscosity of 10 to 500,000 centistokes at 25° C., and preferably 1,000 to 100,000 centistokes at 25° C.

The finely divided silica used in (D-i) may be well-known one and either wet silica or dry silica. Examples include precipitated silica, silica xerogel, and fumed silica, which may have been surface treated with organic silyl groups. Suitable silica is commercially available under the trade name of Aerosil by Nippon Aerosil Co., Ltd., Nipsil by Nippon Silica Co., Ltd., Cab-O-Sil by Cabot Corp. and Santocel by Monsanto Co.

From the standpoints of affinity to and dispersion in silicone oil, the finely divided silica should have a specific surface area of at least 100 m²/g, usually 100 to 500 m²/g, preferably 100 to 400 m²/g as measured by the BET method. The amount of silica added should be 0.1 to 20 parts, preferably 1 to 15 parts by weight per 100 parts by weight of the hydrophobic organopolysiloxane. Less than 0.1 part of silica is ineffective for anti-foaming whereas with more than 20 parts of silica, the composition becomes too viscous and difficult to disperse and work.

The silicone oil compound (D-i) can be obtained by admixing predetermined amounts of the hydrophobic organopolysiloxane and finely divided silica, heat treating the mixture at room temperature or a temperature below 200° C., and optionally, removing a low-boiling fraction therefrom. If desired for the purposes of sustaining an anti-foaming ability and improving high-temperature properties and dilution stability, any of inorganic ammonium salts, organosilicon compounds and siloxane resins may be added (see JP-B 4-42043, JP-A 5-261206 and JP-A 5-261207).

In the foam-suppressing composition (D), the content of the oil compound (D-i) is 5 to 60%, preferably 10 to 50%, and more preferably 20 to 40% by weight. The composition (D) with less than 5% (D-i) is less effective for foam suppression whereas more than 60% (D-i) is less dispersible and awkward to handle.

Component (D-ii) in the foam-suppressing composition (D) is a hydrophilic polyoxyalkylene-modified silicone oil which helps the silicone oil compound (D-i) be emulsified and dispersed in the system, optionally by cooperating with the polyoxyalkylene polymer (D-iii). This silicone oil is represented by the following general formula (2).

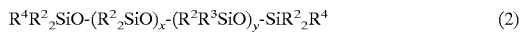

$$R^4R^2_2SiO\text{-}(R^2_2SiO)_x\text{-}(R^2R^3SiO)_y\text{-}SiR^2_2R^4 \qquad (2)$$

Herein R² represents substituted or unsubstituted monovalent hydrocarbon groups of 1 to 18 carbon atoms, especially 1 to 8 carbon atoms, for example, alkyl groups such as methyl, ethyl, propyl, butyl, pentyl, hexyl, heptyl, octyl, nonyl, decyl, dodecyl, tetradecyl, hexadecyl, and octadecyl; cycloalkyl groups such as cyclohexyl; alkenyl groups such as vinyl and allyl; aryl groups such as phenyl and tolyl; aralkyl groups such as 2-phenylethyl and 2-methyl-2-phenylethyl; and the foregoing groups in which some or all of the hydrogen atoms attached to carbon atoms are substituted with halogen atoms, cyano groups, amino groups or the like, such as chloromethyl, 3-chloropropyl, 3,3,3-trifluoropropyl, cyanoethyl, 3-aminopropyl and N-(β-aminoethyl)-γ-aminopropyl. The R² groups may be the same or different although it is preferred that at least 90 mol % of the entire R² groups be methyl.

R³ is a group of the formula: -R⁵O(R⁶O)$_b$(R⁷O)$_c$-R⁸. R⁵ is a divalent hydrocarbon group having 1 to 4 carbon atoms, for example, a C1–C4 alkylene group such as methylene, ethylene, propylene or butylene. R⁶ is ethylene, and R⁷ is propylene. R⁸ is hydrogen or a monovalent organic group selected from among alkyl groups having 1 to 6 carbon atoms (e.g., methyl, ethyl, propyl, butyl, pentyl and hexyl), acetyl groups, and isocyanate groups. The letter b is an integer of 3 to 100, preferably 10 to 50. If b is less than 3, it is difficult to emulsify the oil compound composition. If b is more than 100, the oil compound composition becomes viscous when diluted and awkward to process. The letter c is an integer of 0 to 100, preferably 0 to 20. If c is more than 100, it is difficult to emulsify the oil compound composition.

R⁴ is as defined for R² or R³.

The letter x is an integer of 5 to 100, and especially 10 to 60. If x is less than 5, the anti-foaming effect becomes poor and the storage stability is exacerbated by a drop of viscosity. If x is more than 100, the oil compound composition becomes viscous when diluted and awkward to process. The letter y is an integer of 1 to 10, and especially 3 to 7. If y is less than 1, it is difficult to emulsify the oil compound composition. If y is more than 10, the oil compound composition becomes viscous when diluted and awkward to process.

The polyoxyalkylene-modified silicone oil (D-ii) should have a cloud point of at least 40° C., preferably at least 60° C., as measured in a 1% aqueous solution thereof. If the cloud point is lower than 40° C., the foam-suppressing composition may become unstable at high temperature.

Preferably the polyoxyalkylene-modified silicone oil is liquid at room temperature. It should have a viscosity of 10 to 100,000 centistokes at 25° C., preferably 100 to 10,000 centistokes at 25° C. If the viscosity is less than 10 cSt, the foam-suppressing composition may become separable and less stable. A viscosity in excess of 100,000 cSt may adversely affect the dispersion and processing of the foam-suppressing composition.

Commercially available ether-modified silicones may be used as the polyoxyalkylene-modified silicone oil. Alternatively, it is readily obtained by conventional well-known methods, for example, by effecting addition reaction of a polyoxyalkylene compound having aliphatic unsaturated groups (e.g., vinyl or allyl) at ends of its molecular chain to an organopolysiloxane having ≡SiH groups in the presence of a platinum catalyst.

Included are not only silicone oil modified with a single polyoxyalkylene compound, but also silicone oil having incorporated within the same molecule two or more types of polyoxyalkylene groups having different molar ratio or molecular weight, for example, ethylenoxy and propylenoxy groups. Two or more polyoxyalkylene-modified silicone oils of different structure may also be used.

In the foam-suppressing composition (D), the content of the modified silicone oil (D-ii) is 5 to 95%, preferably 10 to 80%, and more preferably 20 to 70% by weight. Less than 5% of (D-ii) is ineffective for helping the anti-foaming agent be dispersed whereas more than 95% of (D-ii) adversely affects the anti-foaming function and rather allows for foaming.

Component (D-iii) in the foam-suppressing composition (D) is a polyoxyalkylene polymer which serves as an emulsifying aid to cooperate with component (D-ii). The blending of component (D-iii) lowers the viscosity of the foam-suppressing composition and thus improves the working efficiency during dispersion. The polyoxyalkylene polymer (D-iii) is not limited in structure as long as it has (R⁹O) groups in a molecule wherein R⁹ is an ethylene or propylene group. It may be linear or branched as represented by the following general formula (3).

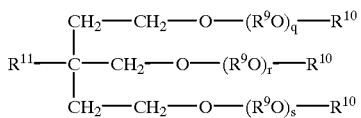

(3)

Herein, $R^{10}$ is hydrogen or a monovalent organic group having 1 to 18 carbon atoms, especially 1 to 8 carbon atoms, such as an alkyl, aryl or alkenyl group, $R^{11}$ is an alkyl group having 1 to 18 carbon atoms, q, r and s are integers.

The terminal groups represented by $R^{10}$ generally include hydrogen, alkyl groups such as methyl, ethyl, butyl, decyl and octadecyl, aryl groups such as phenyl and tolyl, alkenyl groups such as vinyl and allyl, acyl groups such as acetyl and stearoyl, and isocyanate groups, though are not limited thereto.

The polyoxyalkylene polymer should have an average molecular weight of 500 to 5,000, preferably 1,000 to 3,000. A polyoxyalkylene polymer with a molecular weight of less than 500 has a low viscosity so that the resulting foam-suppressing composition may have poor aging stability. A polyoxyalkylene polymer with a molecular weight of more than 5,000 has a high viscosity and becomes difficult to disperse and process. Component (D-iii) is not limited to a single polyoxyalkylene polymer, and two or more polyoxyalkylene polymers having different HLB or different terminal groups may be used in combination.

In the foam-suppressing composition (D), the content of the polyoxyalkylene polymer (D-iii) is 0 to 90%, preferably 0 to 50%, and more preferably 0 to 40% by weight. More than 90% of (D-iii) adversely affects the anti-foaming function.

The foam-suppressing composition (D) may be obtained by mixing predetermined amounts of the above-described components (D-i), (D-ii) and (D-iii). It is only necessary to intimately mix the components using a mixer such as a homomixer. The mixing method is not critical. For example, the components may be mixed while heating at 40 to 150° C.

The foam-suppressing composition (D) is formulated in the epoxy resin composition in an amount of $1 \times 10^{-4}$ to 20 parts, preferably $1 \times 10^{-2}$ to 10 parts by weight per 100 parts by weight of components (A) and (B) combined. Less than $1 \times 10^{-4}$ part of the foam-suppressing composition fails to achieve the desired foam-eliminating and breaking effects whereas more than 20 parts rather allows for foaming, adversely affects adhesion, and bleeds on the surface causing stains on the cured surface.

In the epoxy resin composition, any of well-known inorganic fillers may be added for the purpose of reducing the coefficient of expansion of cured composition. Useful inorganic fillers include fused silica, crystalline silica, alumina, boron nitride, aluminum nitride, silicon nitride, magnesia, and magnesium silicate. If semiconductor devices to be encapsulated generate a substantial amount of heat, it is desired to use inorganic fillers having a higher thermal conductivity and a lower coefficient of expansion, for example, alumina, boron nitride, aluminum nitride and silicon nitride, optionally in admixture with fused silica.

It is desired that the inorganic filler have such a particle size distribution that the mean particle size is 2 to 30 μm and the maximum particle size is up to 74 μm. A mean particle size of less than 2 μm may lead to a higher viscosity, inhibiting loading of a large amount of filler. A mean particle size of more than 30 μm means a more amount of coarse particles which can cause gate clogging and blocking of a thin needle in a dispenser. The mean particle size as used herein can be determined, for example, as the weight average (median diameter) in the particle size distribution as measured by the laser light diffraction method.

The shape of the inorganic filler is not critical. Inorganic fillers in flake, dendrite and spherical forms may be used alone or in admixture of any. If desired, ultrafine silica such as Aerosil is added for imparting thixotropy.

The inorganic filler is preferably blended in an amount of about 100 to 1,000 parts, more preferably about 200 to 900 parts by weight per 100 parts by weight of epoxy resin (A) and curing agent (B) combined.

It is preferred to previously surface treat the inorganic filler with coupling agents such as silane coupling agents and titanate coupling agents because low water absorption, impact resistance and crack resistance are further improved.

Preferred coupling agents are silane coupling agents including epoxy-functional alkoxysilanes such as γ-glycidoxypropyltrimethoxysilane, γ-glycidoxypropyl-methyldiethoxysilane, and β-(3,4-epoxycyclohexyl)-ethyltrimethoxysilane, amino-functional alkoxysilanes such as N-β-(aminoethyl)-γ-aminopropyltrimethoxysilane, γ-aminopropyltriethoxysilane, and N-phenyl-γ-aminopropyl-trimethoxysilane, and mercapto-functional alkoxysilanes such as γ-mercaptopropyltrimethoxysilane. The amount of coupling agent used and the surface treating method are not critical.

In the epoxy resin composition, any of well-known diluents such as n-butyl glycidyl ether, phenyl glycidyl ether, styrene oxide, t-butyl phenyl glycidyl ether, and dicyclopentadiene epoxide may be added for the purpose of lowering the viscosity.

Besides the above-described silane coupling agents and titanate coupling agents, there may be added other coupling agents such as aluminum coupling agents. Also if desired, there may be added colorants such as carbon black, and surfactants other than the foam-suppressing composition (D), such as nonionic surfactants and fluorochemical surfactants serving as a wetter or anti-foaming agent. These additives may be added in customary amounts insofar as the benefits of the invention are not impaired.

The inventive epoxy resin composition may be prepared by agitating, melting, mixing and dispersing the epoxy resin and the curing agent at the same time or separately, optionally under heating, and adding the silicone stress-reducing agent, the foam-suppressing composition and optional additives to the mixture, followed by mixing, agitation and dispersion. The means for use in the mixing, agitation and dispersion of the mixture is not critical although mixers having agitating and heating functions such as attritors, three-roll mills, ball mills and planetary mixers are often used. Such units may be appropriately combined.

Where the epoxy resin composition is used in transfer molding, it may be prepared by intimately mixing the epoxy resin, curing agent, silicone stress-reducing agent, foam-suppressing composition, and optional additives in a high-speed agitating device, then milling the resulting mixture using a hot two-roll mill, continuous kneader or the like. Such units may be appropriately combined.

The epoxy resin compositions of the invention can be readily cured simply by heating. The curing conditions are not critical although heating at about 100 to 190° C. for about ½ to 10 hours is desirable.

The epoxy resin compositions of the invention have advantages including effective infiltration into gaps between semiconductor devices and substrates, few voids formed in the interior and on the surface, and firm adhesion of cured compositions to various substrates. The compositions are thus suitable for the encapsulation of semiconductor devices by potting, COB and screen printing techniques.

EXAMPLE

Examples of the invention and comparative examples are given below by way of illustration, and are not intended to limit the invention. All parts are by weight. The viscosity is a measurement at 25° C.

Synthesis Examples

Foam-suppressing compositions D1 to D11 were prepared by blending components (D-i), (D-ii) and (D-iii) in the formulation shown in Table 1, and agitating them at room temperature in a homomixer at 2,000 rpm for 10 minutes. All the resulting compositions were uniform liquid compositions looking white or grayish white.

TABLE 1

| | Foam-suppressing composition (D) | | | | | | | |
|---|---|---|---|---|---|---|---|---|
| | (D-i) | | (D-ii) | | (D-iii) first | | (D-iii) second | |
| Test No. | Type | Amount (g) | Type | Amount (g) | Type | Amount (g) | Type | Amount (g) |
| D1 | i-1 | 30 | ii-1 | 40 | iii-1 | 15 | iii-2 | 15 |
| D2 | i-1 | 30 | ii-2 | 40 | iii-1 | 15 | iii-2 | 15 |
| D3 | i-1 | 30 | ii-3 | 40 | iii-1 | 15 | iii-2 | 15 |
| D4 | i-2 | 40 | ii-1 | 60 | — | — | — | — |
| D5 | i-2 | 40 | ii-2 | 60 | — | — | — | — |
| D6 | i-2 | 20 | ii-1 | 70 | iii-1 | 5 | iii-2 | 5 |
| D7 | i-2 | 30 | ii-2 | 30 | iii-1 | 20 | iii-2 | 20 |
| D8 | i-1 | 30 | ii-4 | 40 | iii-1 | 15 | iii-2 | 15 |
| D9 | i-2 | 40 | ii-5 | 60 | — | — | — | — |
| D10 | i-1 | 4 | ii-1 | 66 | iii-1 | 15 | iii-2 | 15 |
| D11 | i-1 | 66 | ii-1 | 4 | iii-1 | 15 | iii-2 | 15 |

It is noted that Oil compounds i-1 and i-2 were prepared as follows.

Preparation of Oil Compound

Oil compounds i-1 and i-2 were prepared by the following procedure.

Preparation of Oil Compound i-1

It was prepared by using 100 parts of a dimethylpolysiloxane KF-96 having a viscosity of 1,000 cSt (Shin-Etsu Chemical Co., Ltd.) as the hydrophobic organopolysiloxane and 10 parts of silica Aerosil 200 (Nippon Aerosil Co., Ltd.) having a specific surface area of 200 m²/g and treated with $(CH_3)_3SiNHSi(CH_3)_3$ for surface hydrophobizing as the finely divided silica, adding 0.5 part of ammonium carbonate (Kanto Chemical Co., Ltd.) thereto, and mixing in a nitrogen stream at 150° C. for 3 hours.

Preparation of Oil Compound i-2

It was prepared by using 100 parts of a branched dimethylpolysiloxane containing $CH_3SiO_{3/2}$ units in a molar fraction of 0.023 and having a viscosity of 2,200 cSt as the hydrophobic organopolysiloxane and 3 parts of silica Nipsil HD-2 (Nippon Silica Co., Ltd.) having a specific surface area of 300 m²/g as the finely divided silica and mixing them in a nitrogen stream at 150° C. for 3 hours.

The compounds described under the heading of component (D-ii) and (D-iii) in Table 1 are identified below with their chemical formula and physical properties.

ii-1 $(CH_3)_3SiO-[(CH_3)_2SiO]_{25}-(CH_3R^{15}SiO)_5-Si(CH_3)_3 R^{15}=-C_3H_6O(C_2H_4O)_{25}(C_3H_6O)_{25}C_4H_9$ viscosity: 1,600 cSt, cloudpoint: 35° C.

ii-2 $(CH_3)_3SiO-[(CH_3)_2SiO]_{25}-(CH_3R^{12}SiO)_5-Si(CH_3)_3 R_{12}=-C_3H_6O(C_2H_4O)_{40}(C_3H_6O)_{10}H$ viscosity: 8,600 cSt, cloud point: 72° C.

ii-3 $(CH_3)_3SiO-[(CH_3)_2SiO]_{30}-(CH_3R^{13}SiO)_5-Si(CH_3)_3 R^{13}=-C_3H_6O(C_2H_4O)_{30}(C_3H_6O)_{10}C_4H_9$ viscosity: 1,250 cSt, cloud point: 65° C.

ii-4 $(CH_3)_3SiO-[(CH_3)_2SiO]_{10}-(CH_3R^{14}SiO)_5-Si(CH_3)_3 R^{14}=-C_3H_6O(C_2H_4O)_{13}CH_3$ viscosity: 110 cSt, cloud point: 65° C.

ii-5 $(CH_3)_3SiO-[(CH_3)_2SiO]_{50}-(CH_3R^{16}SiO)_6-Si(CH_3)_3 R^{16}=-C_3H_6O(C_2H_4O)_{20}(C_3H_6O)_{20}COCH_3$ viscosity: 3,900 cSt, cloud point: 38° C.

iii-1 $C_4H_9O(C_2H_4O)_{30}(C_3H_6O)_{10}C_4H_9$ viscosity: 220 cSt iii-2 $C_4H_9O(C_2H_4O)_5(C_3H_6O)_{10}H$ viscosity: 150 cSt Silicone stress-reducing agents 1 and 2 used have structures of the following formulas (5) and (6).

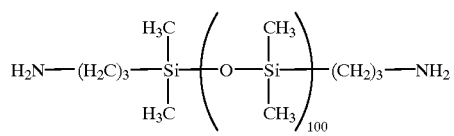

(5)

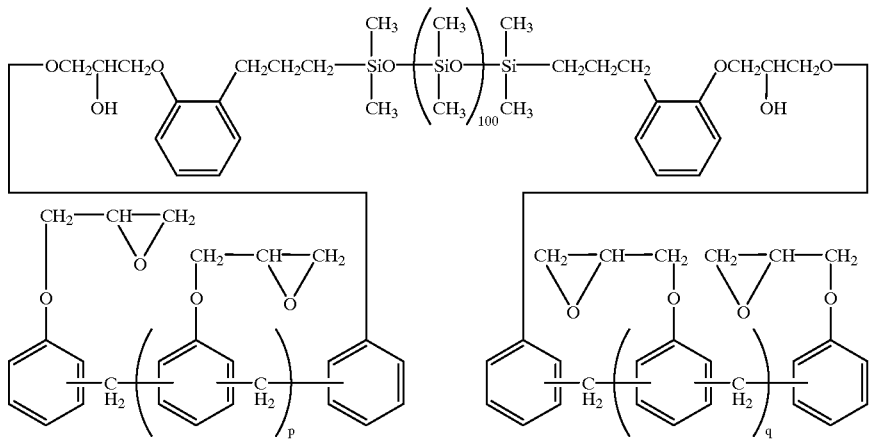

(6)

Herein, p and q are such numbers as to satisfy the allyl equivalent and epoxy equivalent of starting allyl-bearing epoxy resins.

Described below is how to synthesize Silicone stress-reducing agent 2.

Synthesis of Silicone Stress-reducing Agent 2

In a four-necked flask equipped with a reflux condenser, thermometer, stirrer and dropping funnel, 300 g of an epoxidized phenol novolac resin having a softening point of 80° C. (epoxy equivalent 195) was admitted. With stirring at 110° C., a mixture of 32 g of 2-allylphenol and 1 g of tributylamine was added dropwise over 10 minutes. Stirring was continued at 110° C. for a further 2 hours. The unreacted 2-allylphenol and tributylamine were distilled off in vacuum from the contents, yielding an allyl group-bearing epoxy resin having an allyl equivalent of 1,490 and an epoxy equivalent of 235.

A similar four-necked flask was charged with 120 g of the allyl group-bearing epoxy resin produced above, 100 g of methyl isobutyl ketone, 200 g of toluene and 0.04 g of a 2-ethylhexanol-modified chloroplatinic acid solution having a platinum concentration of 2%. After one hour of azeotroping off water, 80 g of an organopolysiloxane blocked with hydrogen atoms at both ends represented by the following formula (7) was added dropwise over 30 minutes at the reflux temperature. Stirring was continued at the temperature for a further 4 hours for reaction. The resulting contents were washed with water and the solvent was distilled off in vacuum. The reaction product was a silicone-modified epoxy resin of the above formula (6) serving as Silicone stress-reducing agent 2.

(7)

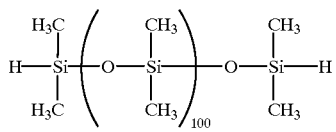

Examples 1–10 and Comparative Examples 1–6

Epoxy resin compositions were prepared by blending according to the formulation shown in Tables 2 and 3, a bisphenol A type epoxy resin RE310 (Nippon Kayaku Co., Ltd.) as the liquid epoxy resin, an acid anhydride MH700 (Shin-Nihon Rika Co., Ltd.) as the curing agent, Silicone stress-reducing agent 1 or 2, fused silica SE15 (Tokuyama Soda Co., Ltd.), silane coupling agent KBM403 (Shin-Etsu Chemical Co., Ltd.), a curing catalyst U-CAT 5002 (Sun-Apro Ltd.), and the foam-suppressing composition shown in Table 1.

The epoxy resin compositions were examined for several properties by the following methods. The results are also shown in Tables 2 and 3.

Test methods

Viscosity:
measured at room temperature by a Brookfield viscometer.

Surface Voids:
The completely deaerated resin composition, 5 g, was admitted into a 5-ml aluminum dish. Using a multi-needle assembly having needles arranged in a lattice of 4×4, 0.2 ml of air was injected into the resin composition to generate 16 bubbles having a volume of about 0.001 ml. The resin composition was cured on a hot plate at 80° C. for 2 hours whereupon the number of surface voids was counted.

Bubble formation:
Only the completely deaerated resin portion, 25 g, of the resin composition shown in Tables 2 and 3 from which SE15, KBM403 and U-CAT 5002 were omitted, was admitted into a 250-cc glass bottle, which was heated at 40° C. for one hour and shaken for 10 minutes by a shaking machine. The amount of bubbles formed was measured.

TABLE 2

| Composition (pbw) | | Example 1 | 2 | 3 | 4 | 5 | 6 | 7 | 8 | 9 | 10 |
|---|---|---|---|---|---|---|---|---|---|---|---|
| RE310 | | 53.9 | 53.9 | 53.9 | 41.2 | 53.9 | 53.9 | 53.9 | 53.9 | 53.9 | 53.9 |
| MH700 | | 49.2 | 49.2 | 49.2 | 49.2 | 49.2 | 49.2 | 49.2 | 49.2 | 49.2 | 49.2 |
| Silicone stress-reducing agent 1 | | 2 | 2 | 2 | | 2 | 2 | 2 | 2 | 2 | 2 |
| Silicone stress-reducing agent 2 | | | | | 15 | | | | | | |
| SE15 | | 300 | 300 | 300 | 300 | 300 | 300 | 300 | 300 | 300 | 300 |
| KBM403 | | 1 | 1 | 1 | 1 | 1 | 1 | 1 | 1 | 1 | 1 |
| U-CAT 5002 | | 0.7 | 0.7 | 0.7 | 0.7 | 0.7 | 0.7 | 0.7 | 0.7 | 0.7 | 0.7 |
| Foam-suppressing composition | D1 | 1 | 5 | 10 | 5 | | | | | | |
| | D2 | | | | | 5 | | | | | |
| | D3 | | | | | | 5 | | | | |
| | D4 | | | | | | | 5 | | | |
| | D5 | | | | | | | | 5 | | |
| | D6 | | | | | | | | | 5 | |
| | D7 | | | | | | | | | | 5 |
| Viscosity (poise) | | 300 | 300 | 310 | 330 | 310 | 310 | 300 | 320 | 320 | 320 |
| Number of surface voids | | 1 | 0 | 0 | 1 | 2 | 2 | 1 | 3 | 3 | 3 |
| Bubble formation (cc) | | 2 | 0 | 0 | 0 | 3 | 3 | 0 | 5 | 5 | 5 |

TABLE 3

| Composition (pbw) | | Comparative Example 1 | 2 | 3 | 4 | 5 | 6 |
|---|---|---|---|---|---|---|---|
| RE310 | | 53.9 | 53.9 | 53.9 | 53.9 | 53.9 | 41.2 |
| MH700 | | 49.2 | 49.2 | 49.2 | 49.2 | 49.2 | 49.2 |
| Silicone stress-reducing agent 1 | | 2 | 2 | 2 | 2 | 2 | |
| Silicone stress-reducing agent 2 | | | | | | | 15 |
| SE15 | | 300 | 300 | 300 | 300 | 300 | 300 |
| KBM403 | | 1 | 1 | 1 | 1 | 1 | 1 |
| U-CAT 5002 | | 0.7 | 0.7 | 0.7 | 0.7 | 0.7 | 0.7 |
| Foam-suppressing composition | D8 | | 5 | | | | 5 |
| | D9 | | | 5 | | | |
| | D10 | | | | 5 | | |
| | D11 | | | | | 5 | |
| Viscosity (poise) | | 300 | 310 | 280 | 300 | 350 | 350 |
| Number of surface voids | | 5 | 3 | 12 | 16 | 8 | 15 |
| Bubble formation (cc) | | 10 | 50 | 10 | 250 | 5 | 250 |

It is evident from Tables 2 and 3 that the epoxy resin compositions within the scope of the invention have the advantages of improved infiltration and minimized formation of voids on the surface of cured products.

Example 11 & Comparative Example 7

There were blended 167.9 parts of an epoxy cresol novolac resin EOCN1020 (Nippon Kayaku Co., Ltd.), 90.6 parts of a phenolic resin TD2093 (Dainippon Ink & Chemicals, Inc.), 36.6 parts of a brominated epoxy resin BREN—S (Nippon Kayaku Co., Ltd.), 15.0 parts of Silicone stress-reducing agent 1, 678.9 parts of fused silica RD 8 (Tatsumori K. K.), 3 parts of carbon black, 3 parts of carnauba wax, 3 parts of a silane coupling agent KBM403 (Shin-Etsu Chemical Co., Ltd.), 2.4 parts of a curing catalyst TPP (Hokko Chemical K. K.), and 5 parts of foam-suppressing composition D1 shown in Table 1. They were mixed in a high-speed mixer and milled in a continuous kneader, obtaining an epoxy resin composition for transfer molding (Example 11).

An epoxy resin composition for transfer molding (Comparative Example 7) was obtained by kneading the ingredients as in Example 11 except that the foam-suppressing composition was omitted.

Each of the epoxy resin compositions of Example 11 and Comparative Example 7 was molded and cured at a temperature of 175° C. and a molding pressure of 70 kgf/cm$^2$ for 2 minutes. The cured parts were examined for spiral flow and formation of internal voids by the following methods, with the results shown in Table 4.

Spiral flow:
measured using a mold according to the EMMI standards

Internal voids:
A 100-pin QFP package having a silicon chip of 8 mm square mounted thereon was encapsulated with the epoxy resin composition under the above-described conditions. Using a soft x-ray apparatus, the number of internal voids within the package was counted. The number of internal voids reported in Table 4 is a total for ten packages.

TABLE 4

| | E11 | CE7 |
|---|---|---|
| Spiral flow (cm) | 85 | 89 |
| Number of internal voids | 0 | 4 |

It is evident from Table 4 that the epoxy resin composition within the scope of the invention has the advantage of minimized formation of internal voids.

Japanese Patent Application No. 2000-204413 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An epoxy resin composition comprising (A) an epoxy resin, (B) a curing agent, (C) a silicone stress-reducing agent, and (D) a foam-suppressing composition, said foam-suppressing composition (D) comprising (D-i) 5 to 60% by weight of an oil compound consisting of 100 parts by weight of a hydrophobic organopolysiloxane of the following general formula (1):

wherein $R^1$ is at least one group selected from hydroxyl groups and substituted or unsubstituted monovalent hydrocarbon groups of 1 to 18 carbon atoms, and "a" is a number of 1.9 to 2.2, having a viscosity of 10 to 500,000 centistokes at 25° C., and 0.1 to 20 parts by weight of finely divided silica having a BET specific surface area of at least 100 $m^2/g$, (D-ii) 5 to 95% by weight of a hydrophilic polyoxyalkylene-modified silicone oil of the following general formula (2):

wherein $R^2$ which may be the same or different is a substituted or unsubstituted monovalent hydrocarbon group of 1 to 18 carbon atoms, $R^3$ is a group of the formula: $-R^5O(R^6O)_b(R^7O)_c-R^8$ wherein $R^5$ is a divalent C1–C4 hydrocarbon group, $R^6$ is ethylene, $R^7$ is propylene, $R^8$ is hydrogen or a monovalent organic group selected from the class consisting of C1–C6 alkyl, acetyl and isocyanate groups, b is an integer of 3 to 100, c is an integer of 0 to 100, $R^4$ is as defined for $R^2$ or $R^3$, x is an integer of 5 to 100, and y is an integer of 1 to 10, having a cloud point in 1% aqueous solution of at least 40° C. and a viscosity of 10 to 100,000 centistokes at 25° C., and (D-iii) 0 to 90% by weight of a polyoxyalkylene polymer having a molecular weight of 500 to 5,000, said foam-suppressing composition (D) being present in an amount of $1\times10^{-4}$ to 20 parts by weight per 100 parts by weight of components (A) and (B) combined.

2. The epoxy resin composition of claim 1, wherein said epoxy resin (A) is selected from the group consisting of a bisphenol type epoxy resin, a novolac type epoxy resin, triphenolalkane type epoxy resin, a phenolaralkyl type epoxy resin, a biphenylaralkyl type epoxy resin, a stilbene type epoxy resin, a naphthalene type epoxy resin, a biphenyl type epoxy resin and a cyclopentadiene type epoxy resin.

3. The epoxy resin composition of claim 1, wherein said curing agent (B) has two functional groups capable of reacting with the epoxy groups in said (A) epoxy resin.

4. The epoxy resin composition of claim 1, wherein said silicone stress-reducing agent (C) is selected from the group consisting of a silicone rubber, a silicone oil, a silicone-modified resin and a copolymer of silicone polymers and organic polymers.

5. The epoxy resin composition of claim 1, wherein the content of said oil compound (D-i) in said foam-suppressing composition (D) is 10 to 50% by weight.

6. The epoxy resin composition of claim 1, wherein the content of said silicone oil (D-ii) in said foam-suppressing composition (D) is 10 to 80% by weight.

7. The epoxy resin composition of claim 1, wherein said polyoxyalkylene polymer (D-iii) has ($R^9O$) groups in a molecule, wherein $R^9$ is an ethylene or propylene group.

8. The epoxy resin composition of claim 1, wherein the content of said polyoxyalkylene polymer (D-iii) in said foam-suppressing composition (D) is 0 to 50% by weight.

9. The epoxy resin composition of claim 1, wherein said foam-suppressing composition (D) is present in the amount of $1\times10^{-2}$ to 20 parts by weight per 100 parts by weight of components (A) and (B) combined.

* * * * *